United States Patent
Wilson

(10) Patent No.: US 7,764,060 B2
(45) Date of Patent: Jul. 27, 2010

(54) TRANSFORMER BASED VOLTAGE SUPPLY

(75) Inventor: Martin Paul Wilson, Cambridgeshire (GB)

(73) Assignee: Nujira Limited (GB)

( * ) Notice: Subject to any disclaimer, the term of this patent is extended or adjusted under 35 U.S.C. 154(b) by 572 days.

(21) Appl. No.: 10/596,301

(22) PCT Filed: Dec. 7, 2004

(86) PCT No.: PCT/GB2004/005124
§ 371 (c)(1), (2), (4) Date: Apr. 25, 2007

(87) PCT Pub. No.: WO2005/057769
PCT Pub. Date: Jun. 23, 2005

(65) Prior Publication Data
US 2007/0279019 A1 Dec. 6, 2007

(30) Foreign Application Priority Data
Dec. 9, 2003 (GB) .................... 0328504.6

(51) Int. Cl.
*H01F 30/12* (2006.01)
(52) U.S. Cl. .................................. 323/361
(58) Field of Classification Search ............ 323/361, 323/355, 356, 332
See application file for complete search history.

(56) References Cited

U.S. PATENT DOCUMENTS

| 3,721,894 | A | * | 3/1973 | Beckwith | 323/257 |
| 3,725,771 | A | * | 4/1973 | Gilmore | 323/257 |
| 4,884,180 | A | | 11/1989 | Hoffmann | |
| 5,272,618 | A | | 12/1993 | Blake | |
| 5,342,497 | A | * | 8/1994 | Cathel et al. | 204/607 |
| 5,657,214 | A | | 8/1997 | Nguyen et al. | |
| 5,790,005 | A | | 8/1998 | Santi et al. | |
| 2002/0057171 | A1 | | 5/2002 | Patel et al. | |

(Continued)

FOREIGN PATENT DOCUMENTS

EP 0 285 905 10/1988

(Continued)

OTHER PUBLICATIONS

Anderson D. R. et al., "High-efficiency high-level modulator for Use in Dynamic envelope tracking CDMA RF power amplifiers", 2001 IEEE MIT-S International Microwave Symposium Digest (CAT. No. 01CH37157), vol. 3, 2001, pp. 1509-1512 vol., IEEE Piscataway, NJ, USA.

(Continued)

*Primary Examiner*—Shawn Riley
(74) *Attorney, Agent, or Firm*—DeMont & Breyer LLC

(57) ABSTRACT

There is disclosed a voltage summer including a transformer having a primary side and a secondary side, wherein a first voltage to be summed is connected to the primary side and a second voltage to be summed is connected to the secondary side. There is further disclosed a transformer comprising a primary winding and a secondary winding and having a turns ratio of primary winding to secondary winding of x:y, providing x turns in series in the primary winding and providing y turns in series in the secondary winding; providing an equal number of turns in the primary and secondary windings; and closely coupling each primary winding turn with a secondary winding turn.

28 Claims, 8 Drawing Sheets

U.S. PATENT DOCUMENTS

2003/0158478 A1    8/2003    Petersen et al.

FOREIGN PATENT DOCUMENTS

| EP | 0285905   | 10/1988 |
| GB | 717075    | 10/1954 |
| GB | 2 398 648 | 8/2004  |
| JP | 08149899  | 7/1996  |
| SU | 1001396   | 2/1983  |

OTHER PUBLICATIONS

Kenneth Dierberger, "Simple and inexpensive high-efficiency power amplifier using new APT MOSFETs", Advanced Power Technology, PAT9403, www.advancedpower.com, Nov. 1994.

Pallab Midya et al, "Tracking power converter for supply modulation of RF power amplifiers", URL:http//ieeexplore.ieee.org/ie15/7571/20629/00954338.pdf, IEEE, 2001.

David K. Su et al., "An IC for Linearizing RF power amplifiers using envelope elimination and restoration", URL:http//ieeexplore.ieee.org/ie14/4/15831/00735710.pdf, IEEE Journal of solid-state circuits, Dec. 12, 1998.

A. Roider, "Patent Application No. PCT/GB2004/005124 International Preliminary Report on Patentability", Jul. 11, 2005, Publisher: PCT, Published in: EP.

Roider, Anton, "EP Application No. 04 805 945.5 Examination Report", Mar. 26, 2009, Publisher: EPO, Published in: EP.

Albert et al., "Design and Evaluation of an Active Ripple Filter Using Voltage Injection", 2001, Publisher: IEEE, Published in: MA.

Chow et al., "Design and Evaluation of an Active Ripple Filter Using Voltage Injection", 2001, Publisher: IEEE, Published in: MA.

* cited by examiner

TRANSFORMER BASED VOLTAGE SUPPLY

FIELD OF THE INVENTION

The present invention relates to the provision of a voltage. The invention is concerned particularly, but not exclusively, with the provision of a supply voltage to a power amplifier, in an arrangement in which the supply voltage may be selectable. The invention is particularly but not exclusively concerned with the control of a supply voltage to an amplifier such as a broadband radio frequency (RF) amplifier having a wide dynamic range.

BACKGROUND TO THE INVENTION

Transistor amplifiers have a peak efficiency for a particular input power that is a function of geometry (i.e. circuit components and layout), load and supply voltage. In conventional radio frequency (RF) power amplification these characteristics are fixed based on the peak input level expected. For amplifiers presented with an input signal having a wide dynamic range, the input signal infrequently achieves peak levels and frequently operates below peak levels. As such, the amplifier may exhibit low overall efficiency.

A solution to the problem of low amplifier efficiency is to vary one or more of the above-stated characteristics (geometry, load, supply voltage) in response to the input signal. Techniques to vary one or more of these characteristics are known in the art.

Techniques that vary the device geometry and load tend to be very dependent on the particular power amplifier topology used, and generally present challenging RF problems. Repeatability of such designs in production is generally a problem.

Various techniques are known in the art for enhancing amplifier efficiency based on the supply voltage. Of supply voltage based efficiency enhancement schemes, there are two broad classifications of solution. These solutions are:

(i) envelope elimination and restoration, and
(ii) envelope tracking.

Envelope elimination and restoration requires the amplifier to be driven saturated, and all the envelope information to be applied through the amplifier supply. This technique tends to be generally too demanding upon the supply modulator when using high modulation bandwidths, and thus has limited usefulness in practical applications.

With envelope tracking, the amplifier is driven in a substantially linear fashion. Envelope tracking requires an efficient power supply capable of delivering high modulation power bandwidths. In known techniques, a switched mode pulse width modulator (commonly referred to as class S) is used to realise an efficient variable supply to the power amplifier. However, in order to operate at full bandwidth, the supply must switch at many times the bandwidth of the modulation, and this excessively high switching speed results in poor modulator efficiency.

In another prior art envelope tracking technique, a plurality of highly efficient intermediate power supplies are provided, and the power supplies are switched as required by the envelope level. This switching creates transient disturbances that degrade the spectrum with high order intermodulation products, and makes linearisation difficult by introducing supply dependent non-linearities alongside input dependent non-linearities.

In a further modification to this technique, the switching of the power supplies is combined with a linear amplifier to provide a smooth transition between switch levels and remove the supply dependent linearisation requirement. The aim of this form of envelope tracking is to provide a unique value of supply voltage for every envelope level. However, there is a problem in achieving this without impact upon tracking speed capability.

A variable level power supply must be able to switch between different supply levels in order to provide the necessary varied voltage supply levels. One known method of achieving this is to provide a means of coarse switching between a number of voltage sources, However this course switching results in errors in the voltage supply signal, as illustrated in FIG. 1. Referring to FIG. 1, reference numeral 206 denotes a dashed line representing the idealised envelope of the power supply voltage. This idealised power supply envelope 106 preferably tracks the envelope of the input signal to a device which the power supply is driving, such as a power amplifier. The reference numeral 102 denotes a line representing the envelope of the input signal to the device.

However, in practice, using coarse switching, the power supply envelope follows a shape as represented by the stepped curve 104. In the example illustrated with reference to FIG. 1, it is assumed that the switched supply has four coarse levels $V_1$ to $V_4$. As the envelope of the input signal to the input signal to the device, 102, reaches the one of the voltage levels $V_1$ to $V_4$, the supply voltage is appropriately switched. As can therefore be seen in FIG. 1, the supply voltage switches between four levels. As such, there are portions of the cycle where the supply voltage is excessive, and is therefore in error. As illustrated by the hatched area 108, the stepped supply voltage implementation gives rise to inefficiencies, as the hatched area 108 represents wasted energy.

In order to address this problem, it is known to sum the selected coarse voltage with a finely adjustable voltage source in order to provide interpolation, and to minimise the error.

A particularly advantageous technique for controlling the selection of the supply voltage, and adjustments thereto, to improve efficiency is taught in British patent application publication number 2398648.

It is an aim of the present invention to provide an improved scheme for summing voltages in the generation of a supply voltage.

SUMMARY OF THE INVENTION

According to one aspect of the invention there is provided a voltage summer including a transformer having a primary side and a secondary side, wherein a first voltage to be summed is connected to the primary side and a second voltage to be summed is connected to the secondary side.

The first voltage may be connected between the first tap of the primary side and the second tap of the primary side, and the second voltage is connected to a first tap of the secondary side, a summed voltage being provided on a second tap of the primary or secondary side.

The first voltage may be greater than the second voltage and the summed voltage is provided on the second tap of the primary side of the transformer.

The first voltage may be a variable voltage. The first voltage may be provided by a first switchable voltage source. The second voltage may be variable. The second voltage may be provided by a second switchable voltage source.

The first voltage may be variable between n levels and the second voltage is variable between m levels, wherein the summed voltage is variable between n*m levels.

The second voltage may be provided by a continuously variable voltage source.

The first voltage may be a coarse voltage signal and the second voltage may be a fine voltage signal. The fine voltage signal may be representative of an error in the course voltage signal.

The voltage summer may further include a reference voltage source, and a difference means for removing the reference voltage from the summed voltage to generate the second voltage.

The voltage summer may further include a reference current source, a means for sensing the current in the primary side of the transformer, a difference means for removing the reference current from the sensed current to generate a difference current, and a driver for supplying the second voltage in dependence on the difference current.

A power supply preferably includes a voltage summer as defined. The power supply is preferably for driving a power amplifier, preferably an RF power amplifier.

In a further aspect, the invention provides a method of summing voltages including applying a first voltage to a primary side of a transformer and applying a second voltage to a secondary side of the transformer, wherein a sum of the first and second voltages is provided on one of the first or second sides of the transformer.

The first voltage is preferably applied between the first tap of the primary side and the second tap of the primary side, and the second voltage is preferably applied to a first tap of the secondary side, wherein a summed voltage is provided on a second tap of the primary or secondary side.

The first voltage may be greater than the second voltage and the summed voltage may be provided on the second tap of the primary side of the transformer.

The method may further comprise the step of varying the first voltage. The method may further comprise the step of varying the second voltage. The method may comprise varying the first voltage between n levels and varying the second voltage between m levels, wherein the summed voltage is thereby variable between n*m levels.

The first voltage may be a coarse voltage signal and the second voltage may be a fine voltage signal. The fine voltage signal may be representative of an error in the course voltage signal.

The method may further include the step of generating a reference voltage, and removing the reference voltage from the summed voltage to thereby generate the second voltage.

The method may further include the step of generating a reference current, sensing the current in the primary side of the transformer, removing the reference current from the sensed current to generate a difference current, and supplying the second voltage in dependence on the difference current.

In a further aspect, the invention provides a transformer comprising a primary winding and a secondary winding and having a turns ratio of primary winding to secondary winding of x:y, the transformer including: x turns in series in the primary winding and y turns in series in the secondary winding; an equal number of turns in the primary and secondary windings. each primary winding turn closely coupled with a secondary winding turn.

The closely coupled turns are preferably coupled in parallel. The number of turns in the primary and secondary winding is preferably x*y. There is preferably provided y parallel branches in the primary winding, each with x turns.

There is preferably provided x parallel branches in the secondary winding, each with y turns.

There is preferably provided z branches in the primary winding, the number of turns in the primary winding being z*x*y. There may be provided z*x/y branches in the secondary winding. There may be an equal number of turns in each parallel branch. The number of branches in the primary winding may be y*z, the number of branches in the secondary winding being x*z.

There may be provided a plurality of primary windings i each having a turns ratio of primary winding to secondary winding of $x_i$:y, wherein each turn of each primary winding is closely coupled with a turn of each other primary winding.

The number of turns in the primary and secondary winding may be the lowest common multiple of $x_i$*y for all i.

The lowest common multiple may be t, the number of branches in each primary winding being $t/x_i$, and each having $x_i$ turns. The number of branches in the secondary winding may be t/y, each having y turns.

There may be provided $p_i$ branches in each primary winding, the number of turns in each primary winding being $p_i$*$x_i$*y.

In a further aspect there is provided a transformer comprising a plurality i of primary windings and a secondary winding and having a turns ratio of primary winding to secondary winding of $x_i$:y, the transformer including: $x_i$ turns in series in each primary winding i and y turns in series in the secondary winding; an equal number of turns in each primary and secondary windings; and each primary winding turn being closely coupled with a turn of every other primary winding and with a secondary winding turn. Such transformer may thereby be used to sum a plurality of voltages.

BRIEF DESCRIPTION OF THE DRAWINGS

The present invention in now described by way of example with reference to the accompanying Figures, in which:—

DESCRIPTION OF PREFERRED EMBODIMENTS

Figure 1:
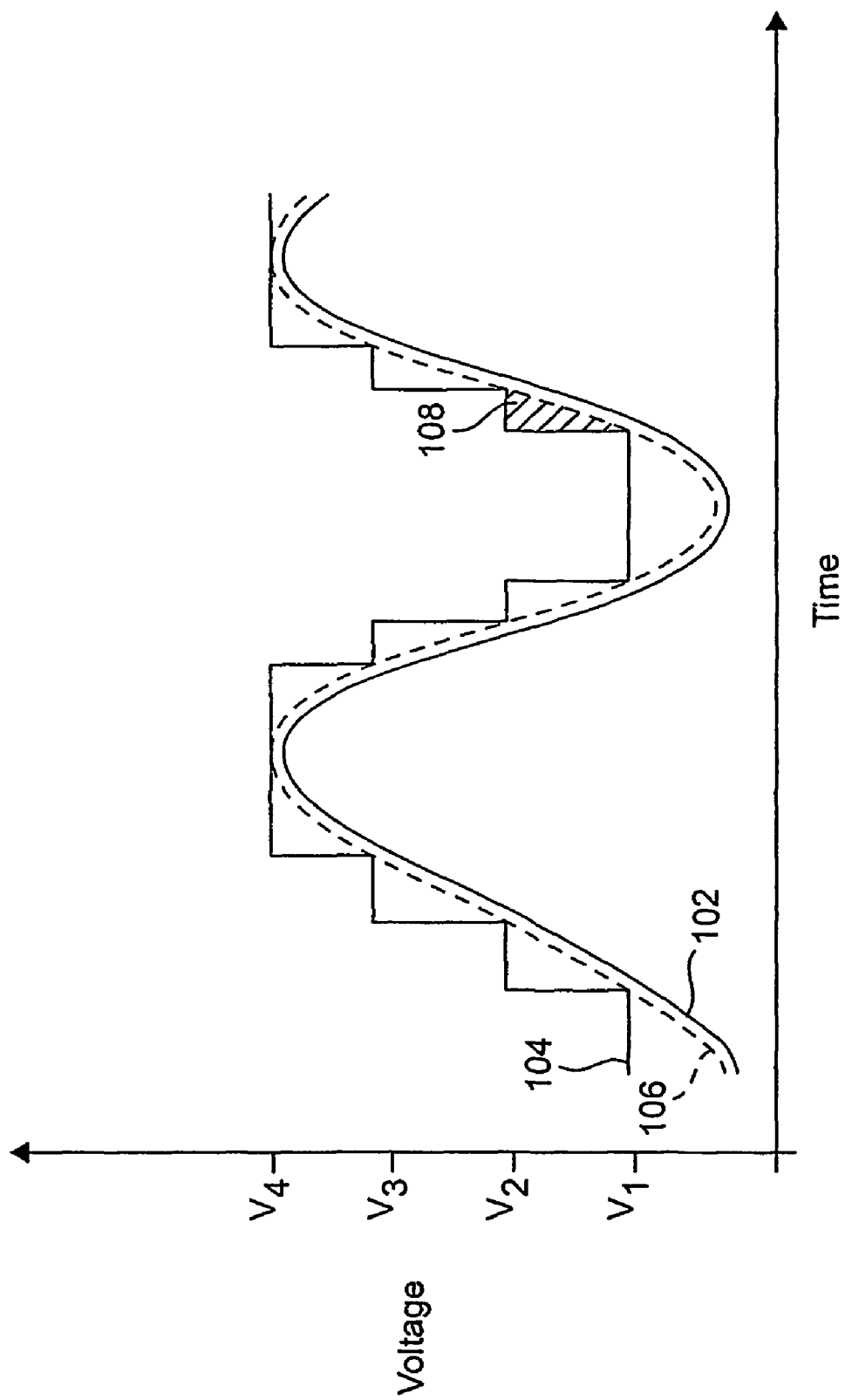
FIG. 1 illustrates the principle of errors in a stepped supply voltage.

The present invention is described herein by way of particular examples and specifically with reference to a preferred embodiment. It will be understood by one skilled in the art that the invention is not limited to the details of the specific embodiments given herein. In an embodiment the invention is described herein by way of reference to the provision of a power supply for an RF amplification stage. However more generally the invention may apply to any arrangement where it is necessary to switch between a plurality of voltage supplies in order to provide a modulatable power supply.

It should be noted that where the same reference numerals are used in different Figures, they refer to the same elements.

Figure 2:
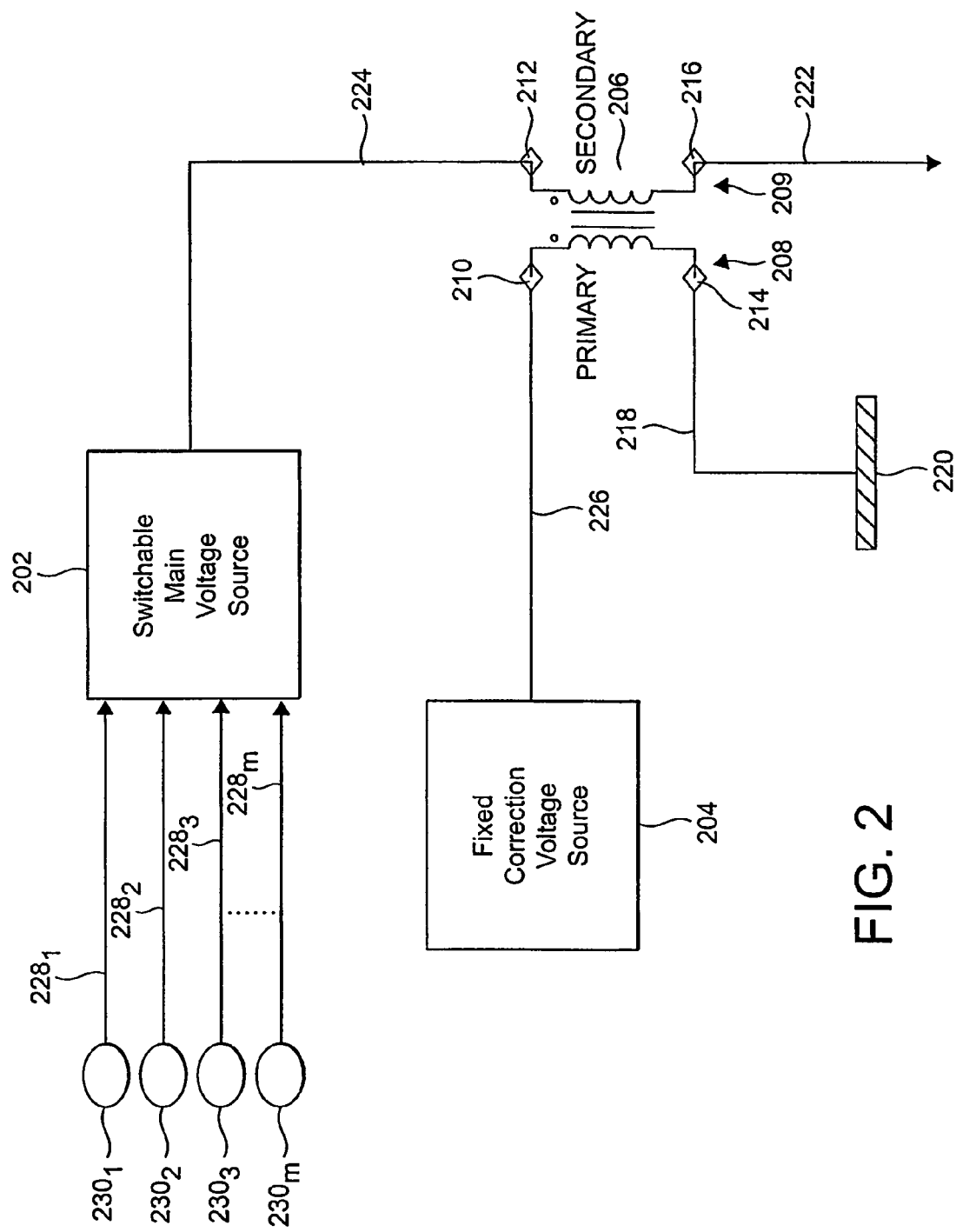
FIG. 2 illustrates the use of a transformer to sum a coarse and fine voltage in accordance with an first embodiment of the invention.

Referring to FIG. 2, there is illustrated a first exemplary embodiment incorporating the principles of an aspect of the invention. In FIG. 1 there is illustrated a transformer 206, a switchable main voltage source 202, and a fine correction voltage source 204.

The transformer 206 has a secondary side generally designated by reference numeral 209, and a primary side generally designated by reference numeral 208. The primary side 208 has a first connection point or tap 210, and a second connection point or tap 214. The secondary side has a first connection point or tap 212, and a second connection point or tap 216.

The switchable main voltage source 202 receives a plurality m of DC voltages on lines $228_1$ to $228_m$ from respective DC voltage sources $230_1$ to $230_m$. The switchable main voltage source 202 is controlled, by means not shown but understood by one skilled in the art, to switch one of the plurality m voltages at its inputs to its output on line 224.

The fine correction voltage source 204, which in the embodiment of FIG. 2 is a fixed voltage source, provides an alternating voltage signal on an output line 226, to correct errors in the voltage signal provided on the output line 224 of the switchable main voltage source 202. The correction voltage generated on line 226 by the fine correction voltage source 204 is summed with the selected output voltage on line 224 to correct or minimise any error therein.

In accordance with the principles of the invention, the summing operation is performed by the transformer 206. The selected output voltage on the output line 224 of the switchable main voltage source 202 is connected to the first tap 212 of the secondary side 209 of the transformer 206. The fine correction voltage on line 226 is connected to the first tap 210 of the primary side 208 of the transformer 206. The second tap 214 of the primary side 208 of the transformer 206 is connected via a line 218 to ground, which is represented by terminal 220. More generally, it can be considered that the fine correction voltage is applied across the taps of the primary side of the transformer. The second tap 216 of the secondary side 209 of the transformer 206 is connected to a line 222 which provides the output voltage supply. Thus, the output voltage supply on line 222 corresponds to the selected voltage provided on line 224, suitably adjusted by the fine correction voltage on line 226.

In an alternative, the switchable main voltage may be applied across the taps of the primary side of the transformer, and the fine correction voltage applied to the first tap 212 of the secondary side.

The power supply arrangement illustrated in FIG. 2 may be used as a modulatable means of supplying power to a radio frequency (RF) amplifier enabling highly efficient amplification of non-constant envelope signals.

As illustrated in FIG. 2, the primary side 208 of the transformer 206 is isolated from the secondary side 209, and thus provides loss-less summing of the two voltages.

In a further embodiment, the fine correction voltage source 204 may be replaced by a switched highly efficient voltage source, which is switched independent of the switching in the switchable main voltage source 202. Such an adaptation of the arrangement of FIG. 2 is illustrated in FIG. 3.

Figure 3:
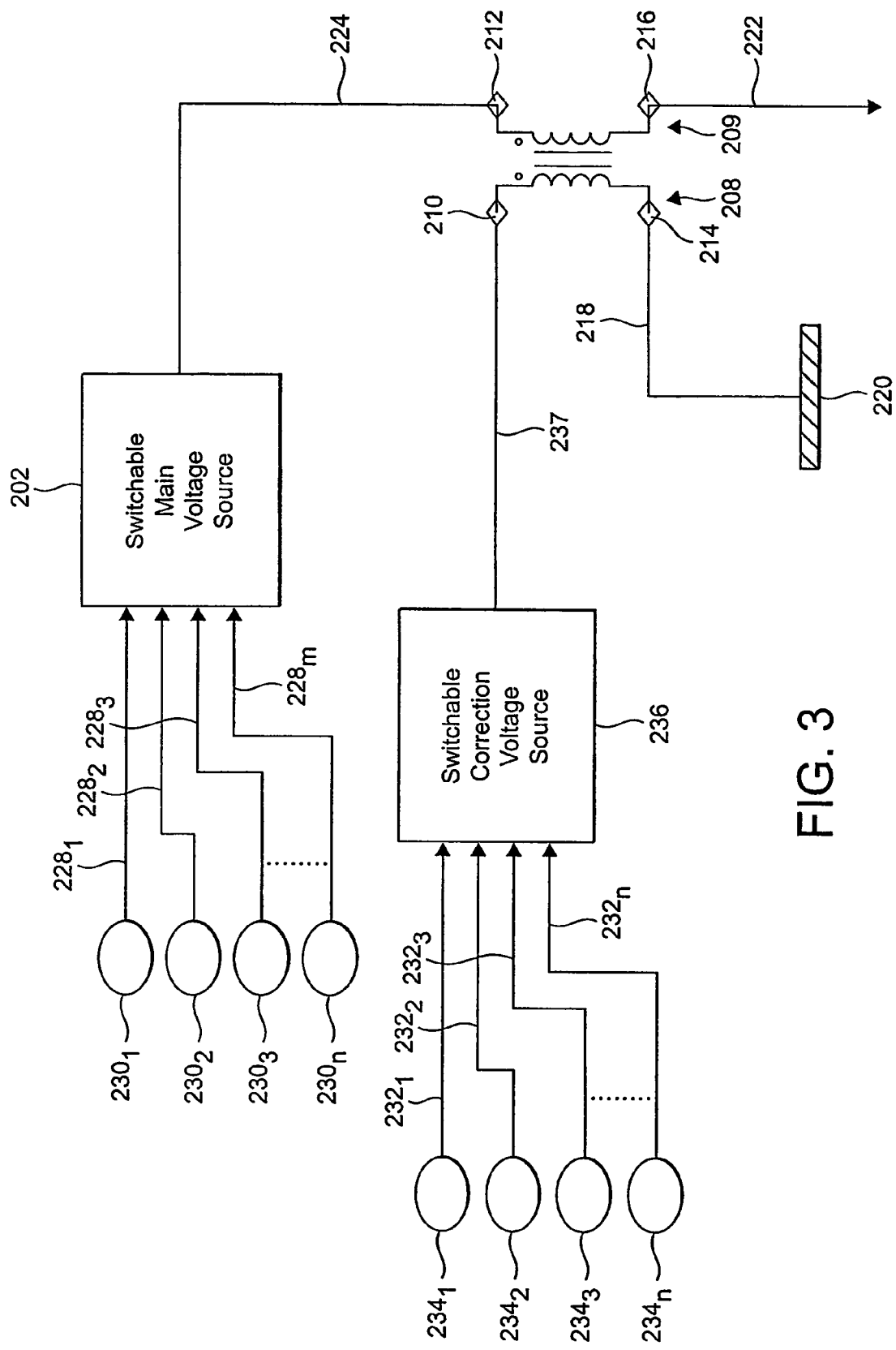
FIG. 3 illustrates the use of a transformer to sum a coarse and fine voltage in accordance with a second embodiment of the invention.

As illustrated in FIG. 3, the fine correction voltage source 204 of FIG. 2 is replaced with a switchable fine correction voltage source 236. The switchable fine correction voltage source 236 receives a plurality n of input voltages on lines $232_1$ to $232_n$. The plurality n of input voltages are provided by a plurality n of voltage sources $234_1$ to $234_n$, connected to the respective lines $232_1$ to $232_n$. The switchable correction voltage source 236 is controlled to select an appropriate one of the voltages on the input lines $232_1$ to $232_n$ to be output on its output line 237, which is connected to the first tap 210 of the secondary side 208 of the transformer 206.

The arrangement of FIG. 3 provides a more efficient solution than the arrangement of FIG. 2. As the main voltage source may be switched between m supply voltages, and the correction voltage source may be switched between n supply voltages, the effective resolution of the voltage supply provided on the output supply line 222 is n.m.

Figure 4:
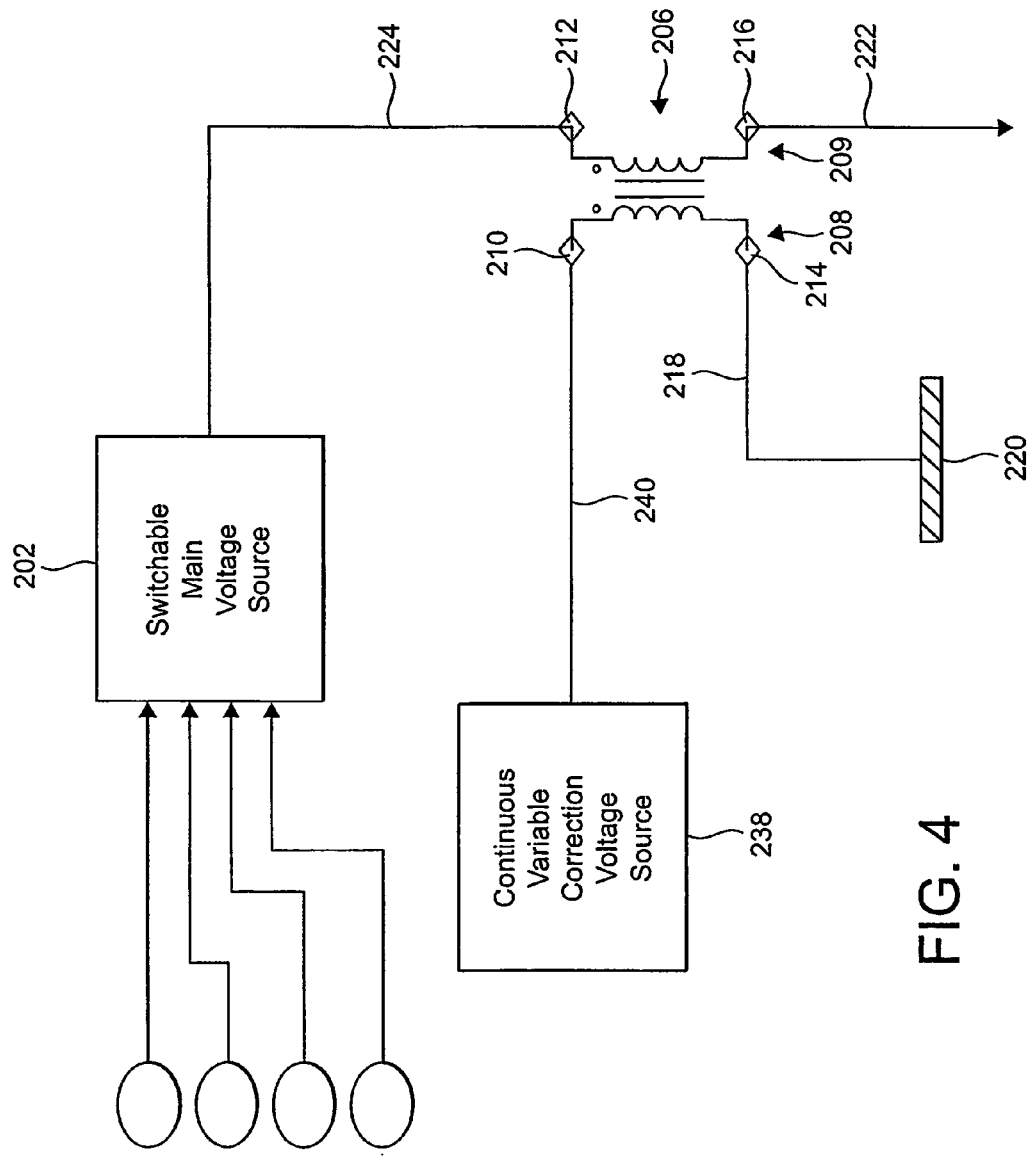
FIG. 4 illustrates the use of a transformer to sum a coarse and fine voltage in accordance with a third embodiment of the invention.

A further embodiment incorporating the principles of the invention is illustrated with respect to FIG. 4. In FIG. 4 the fine correction voltage source 204 of FIG. 2 is replaced with a continuously variable fine correction voltage source 238, as opposed to the switchable variable fine correction voltage source of FIG. 2. The continuously variable fine correction voltage source 238 generates a continuously variable correction voltage on line 240, which is connected to the first tap 210 of the primary side 208 of the transformer 206.

As mentioned above, use of the transformer 206 provides a loss-less technique for summing the main voltage source with the correction voltage source. As illustrated by the various embodiments of FIGS. 2 to 4, the correction voltage source may be provided in a number of ways. The invention is not limited to any particular technique for generating either the main (coarse) voltage source or the correction (fine) voltage source. Either the main voltage source or the correction voltage source could be a combination of switches and resistive or reactive interpolation means in order to provide the necessary accuracy demanded by a particular application. The invention is thus not limited to the specific implementations for generating the main voltage source or correction voltage source illustrated with reference to FIGS. 2 to 4.

In implementing the principles of the embodiments of the invention illustrated in relation to the embodiments of FIGS. 2 to 4, it can be seen that the broad principle is the use of a transformer to sum two voltages. Specific construction of the transformer may vary. The principle relies upon one voltage being connected to the primary side of the transformer, and the other voltage being connected to the secondary side of the transformer.

In delivering a power supply, a power supply means may be applied to one side of the transformer, and the power supply for driving a device, preferably a power amplifier, delivered by the other side of the transformer.

In a preferred embodiment the transformer is implemented with a larger number of turns on the primary side 208 than on the secondary side 209. This allows for smaller and faster electronic devices to be used in the switch or amplifier circuits connected to the primary side of the transformer, such that the voltages are isolated.

In all embodiments, if the transformer 206 uses a ferromagnetic material for the transformer core, DC current flowing through the core may magnetise the core, and this may result in saturation of the core with a consequent loss of magnetising inductance. In order to overcome this potential problem, in an embodiment a DC current is applied to the primary side 208 of the transformer 206 in such a manner that the magnetic field strength (H) in the primary side 208 cancels the magnetic field strength in the secondary side 209.

This DC current may be applied, in the embodiment of FIG. 4 for example, from the fine correction voltage source 238. The DC current is in the primary side may be sensed by monitoring the current in the primary side 208 of the transformer, and using this sensed current to control the bias point of the fine correction voltage source 238, such that a counter DC current is applied in the secondary side 209 of the transformer. An alternative embodiment is the use of an extra winding not closely coupled to the remaining turns that provides for the cancellation of the DC field in the core. Since the field strength is proportional to the number of turns, a larger number of turns can be wound to reduce the bias current requirement.

Figure 5:
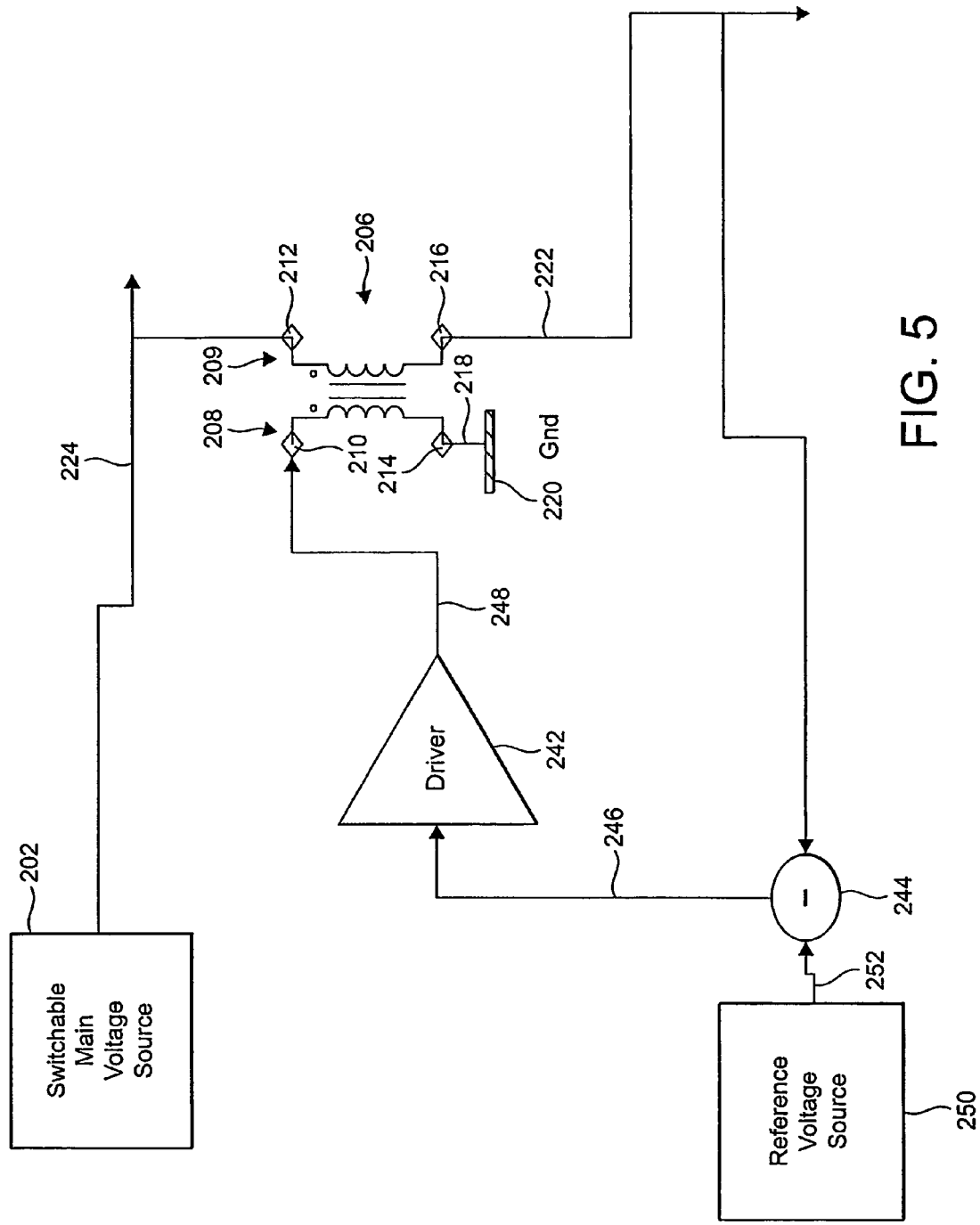
FIG. 5 illustrates the use of a transformer to sum a coarse and fine voltage in accordance with a fourth embodiment of the invention.

A further embodiment utilising the principles of the present invention is illustrated in FIG. 5. In FIG. 5, a reference voltage source 250 is generally indicated. In general, the reference voltage source 250 generates a voltage signal on an output line 252 for the purpose of correcting an error in the voltage signal on line 224 generated by the switchable main voltage source 202. The reference voltage on line 252 forms a first input to a subtractor 244. The second input of the subtractor 244 is provided by the output voltage supply signal on line 222. An output of the subtractor on line 246 forms an input to a driver amplifier 242, which generates an output signal on line 248 which is connected to the first tap 210 of the primary side 208 of the transformer 206. Thus, the transformer 206 sums the main voltage source signal on line 224 with the voltage signal on line 248 provided by the driver 242.

The embodiment of the invention illustrated in FIG. 5 employs a means of measurement and correction of errors by comparing the reference signal on line 252, which is a copy of the wanted signal, with the actual generated signal on line 222. The difference therebetween, output on line 246, is representative of the error. The error is therefore added back in to the signal generated on line 224 by the transformer 206, in order to remove the error from the output signal 222.

The arrangement of FIG. 5 may be used in combination with any one of the arrangements of FIGS. 2 to 4, in particular, the reference voltage source 250 may be implemented as a switchable reference source in accordance with the switchable correction voltage source 236 of FIG. 3.

Figure 6:
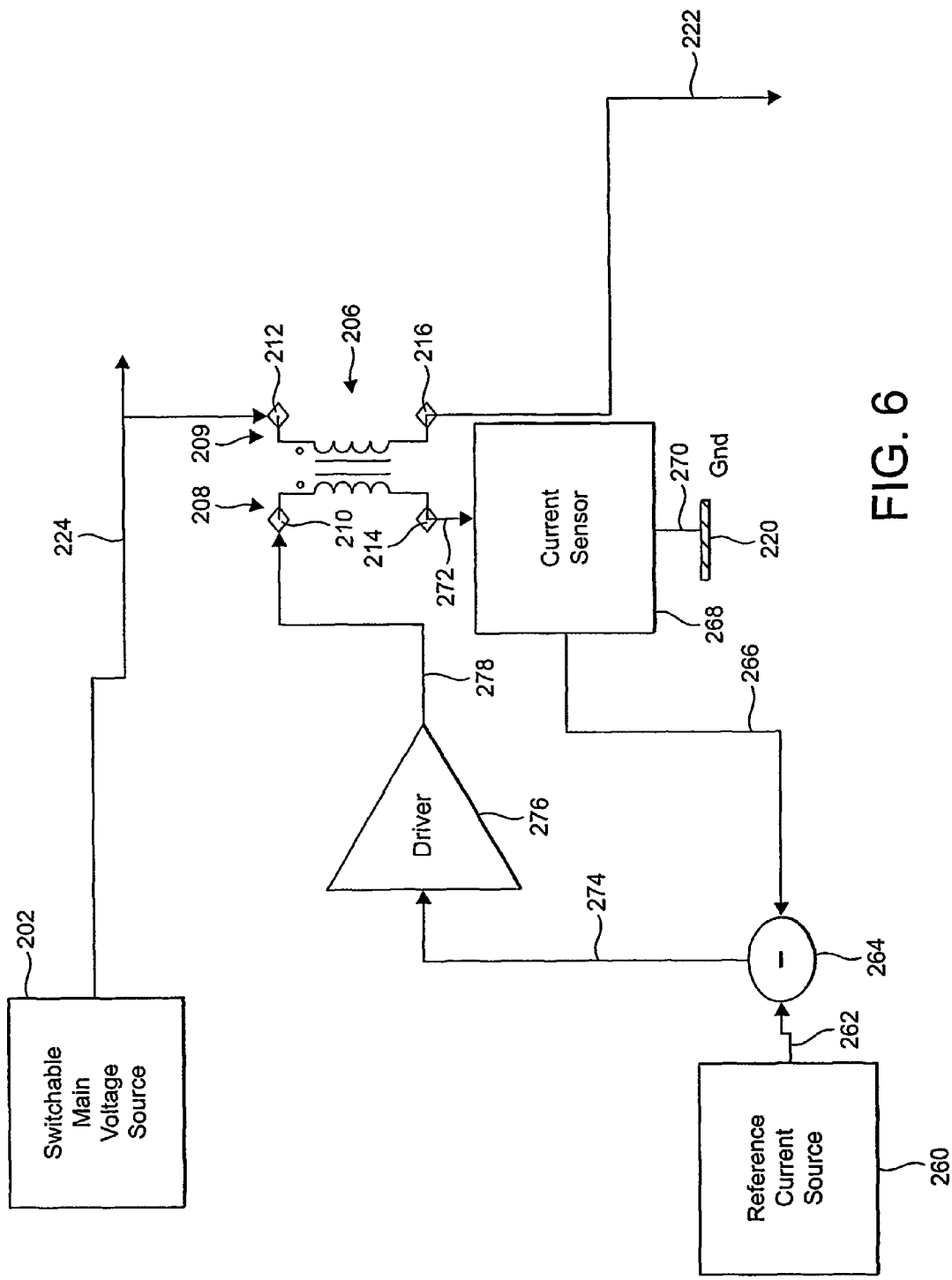
FIG. 6 illustrates the use of a transformer to sum a coarse and fine voltage in accordance with a fifth embodiment of the invention.

An alternative implementation of the feedback correction technique of FIG. 5 is illustrated in FIG. 6. FIG. 6 illustrates the same feedback correction principle of FIG. 5, but implemented using current detection rather than voltage detection.

Referring to FIG. 6, a current sensor 268 is provided with an input line 272 connected to the second tap 214 of the primary side 208 of the transformer 206. The current sensor 268 additionally is connected to the ground terminal 220 via a connection 270. The current sensor 268 provides an output on line 266. A reference current source 260 generates a reference current on line 262, which forms a first input to a subtractor 264. The second input to the subtractor 264 is provided by the signal from the current sensor on line 266. An output of the subtractor 264 on line 274 forms an input to a driver 276. The output of the driver 276 on a line 278 is connected to provide an input at the first tap 210 of the primary side 208 of the transformer 206.

The arrangement of FIG. 6 is arranged such that the transformer 206 is used as a current measurement device in order to correct any error in the output supply voltage generated on line 222. The current flowing in the primary side 209 of the transformer 206 is a measure of the current output of the power supply means. This current is measured, on the secondary side, in the current sensor 268, and compared with a reference current on line 262. Any error in the current is used to drive the primary side 208 of the transformer, in order to correct and substantially remove the error from the output supply voltage.

Thus, as described hereinabove with reference to various embodiments, embodiments of the invention provides a technique in which a transformer is used to add two supply voltages. In the various embodiments, the two supply voltages added are a main supply voltage and a correction voltage.

More generally, these may be considered to be a coarse voltage and a fine voltage. Thus a voltage source having a coarse representation of the desired output voltage, but containing errors which are alternating in nature, is corrected by a voltage source having a fine representation of these errors. The thus corrected voltage source provides an output power supply voltage, which may be used as required in any given implementation. The embodiments have particular advantages when used as a wide bandwidth modulatable power supply, particularly for providing a power supply to a power amplifier.

When used as a wide bandwidth modulatable power supply, it is necessary for the transformer to have a very wide bandwidth. This is particularly the case when the correction of the supply voltage is achieved by feedback through the transformer, as illustrated in the embodiments of FIGS. 5 and 6.

At high frequencies, the performance of some conventional transformers may be restricted. This is because, with some conventional transformers, leakage inductance restricts the high frequency response to the transformer, and hence the bandwidth. The leakage inductance can be overcome by implementing the transformer in a transmission line configuration. However, this is not an appropriate use of the transformer in order to sum voltages, as discussed in the various embodiments hereinabove, since the summing of the voltages in an efficient manner requires the primary and secondary sides of the transformer to be isolated. The isolation is key to achieving loss-less summation of voltages. Thus, the conventional technique for minimising leakage induction, using the transmission line configuration, is not an option.

Thus, in an embodiment of the invention, an adapted transformer is used for the summation of the voltages.

It is proposed that the transformer is adapted in order to maximise the coupling between primary and secondary windings, preferably through use of bifilar or twisted-pair windings. Leakage inductance which is a result of flux lines that do not link between the windings of the transformer through the core are therefore reduced.

Preferably each turn of a primary winding should form one half of the twisted pair, the other half being formed by the secondary winding. In the case of a step down transformer, for example, there will be more primary turns than secondary turns. In order to satisfy the close coupling requirement, in a step down transformer secondary turns are therefore connected in parallel.

In order to reduce leakage inductance, the concept of parallel turns may be extended still further. If the windings are connected in parallel, then the self-inductance of the windings is reduced by a factor equal to the number of windings connected in parallel. However, since the winding fluxes link through the core, the mutual inductance between windings means the combined inductance of a winding is independent of the number of turns wound in parallel.

Since leakage inductance is formed as a result of flux linkages that fail to link through the core, this mutual inductance does not exist for leakage inductance. This means that leakage inductance is reduced by a factor equal to the number of turns connected in parallel, but the magnetising inductance remains constant.

Figure 7:
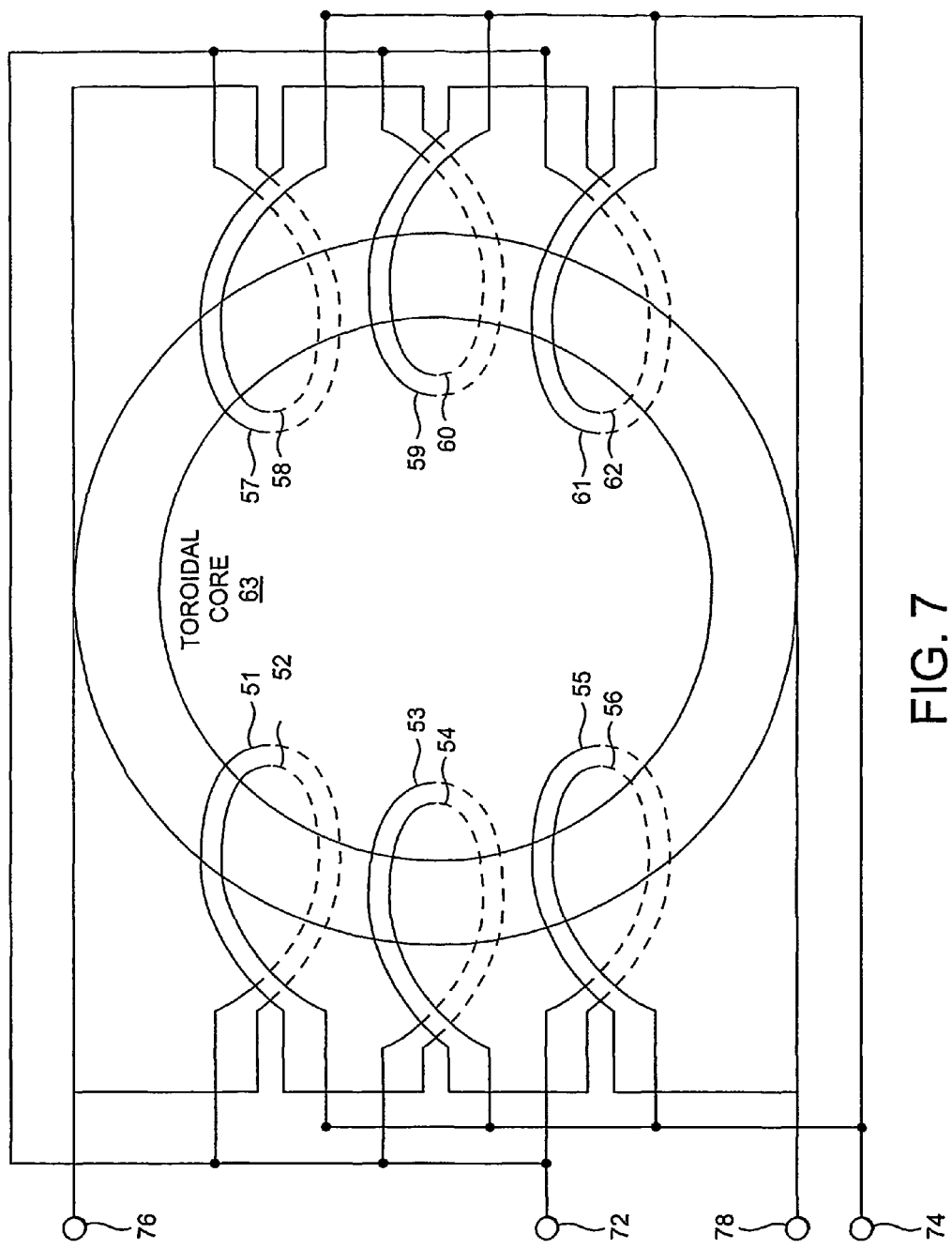
FIG. 7 illustrates a transformer winding adapted in accordance with an embodiment in a further aspect of the invention.

FIG. 7 illustrates an example transformer with the windings adapted in accordance with a preferred embodiment of the invention. A simplified and specific example is illustrated for the purpose of understanding the adapted transformer. However the invention is not limited to the specific example illustrated in FIG. 7. The principles of the invention will be more easily apparent from understanding the exemplary arrangement of FIG. 7. The general principles of the adapted transformer are discussed further afterwards.

Referring to FIG. 7, a toroidal core 63 is provided as the transformer core. A plurality of single turns 51, 53, 55, 57, 59, 61 form the primary winding, and a plurality of single turns 52, 54, 56, 58, 60, 62 form the secondary winding. Each winding is wound around the toroidal core 63.

The example is of a primary side of the transformer consisting of two windings of three turns, the two windings connected in parallel. Reference numerals 51, 53, 55 form one winding, and reference numerals 57, 59, 61 form a second winding.

The secondary windings consist of six single turns, all connected in parallel.

The primary and secondary windings are preferably bifilar wound together. A transformer wound in such a manner as shown in FIG. 7 has an inductance value equivalent to three turns of primary winding and a single turn of secondary winding, thus providing a 3:1 transformer.

As mentioned hereinabove, the example of FIG. 7 is for illustration purposes only and to assist in understanding this aspect of the invention. Any combination of windings in serial or in parallel is possible. Similarly, the positions of the turns on the core in FIG. 7 are such to allow for maximum clarity of illustration, and are not representative of an actual implementation.

Figure 8:
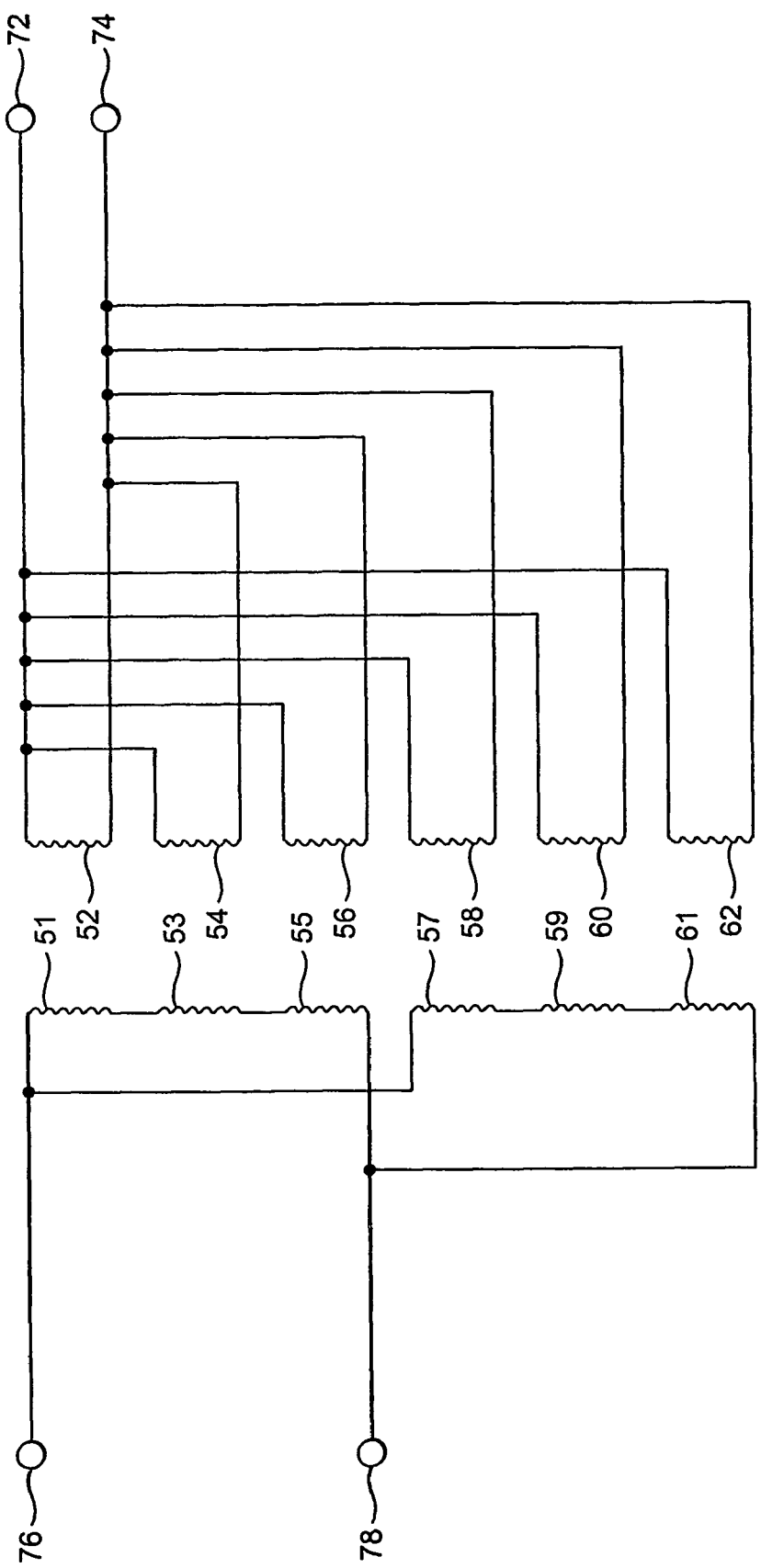
FIG. 8 illustrates a schematically the connection of the transformer windings of the embodiment of FIG. 7.

The principles of embodiment of FIG. 7 are further illustrated with reference to FIG. 8. FIG. 8 illustrates, schematically, the transformer windings of FIG. 7. As can be seen, the three primary windings 51, 53, 55 are connected in series, between terminals 76 and 78 of the primary side of the transformer. Primary windings 57, 59, 61 are similarly connected in series between the terminals 76 and 78. On the secondary side, as seen in FIG. 8, each of the windings 52, 54, 56, 58, 60, 62 are connected between the terminals 72 and 74 of the secondary side of the transformer.

Thus, in this aspect of the invention, the principle is to provide for each winding, on either side of the transformer a complimentary winding, and to closely couple such windings on the core. This may require additional windings to be provided than would otherwise be required, on either the primary or the secondary side, but ensures that leakage inductance is reduced.

The general principles of the construction of the adapted transformer are set-out as follows, for a transformer having a given ratio of x:y from primary to secondary, where x is the number of turns on the primary winding and y is the number of turns on the secondary winding.

The overall number of turns in the primary and secondary winding must be equal. In order to ensure that the number of turns in each winding is equal, a general principle is that each winding should have x*y turns.

Each turn of the primary winding is coupled with a turn of the secondary winding. The coupled turns are then wound in a closely coupled fashion, or bonded.

Where additional turns are added in order to ensure that the total number of turns in each side is x*y, additional turns may need to be connected in parallel branches. Where parallel branches are provided, there must be an equal number of series turns in each of the parallel branches. This applies to parallel branches in the primary side or in the secondary side.

Where a plurality of branches p is provided in the primary side, the total number of turns in each side of the transformer is p*x*y. Where p branches are provided in the primary winding, the total number of secondary branches connected in parallel is p*x/y.

It is possible that p*x/y may become fractional. In such case, it is necessary to factor p*x/y into integer values. The term p is therefore multiplied by the denominator value such that p*x/y becomes an integer. In this way, the principles for adapting the transformer may be scaled to any turns ratio transformer.

In the simple case described hereinabove with reference to FIGS. 7 and 8, the transformer ratio is 3:1, and as such x=3 and y=1. The total number of turns in each winding is therefore initially set at three. The primary winding has three turns connected in series. The secondary winding also has three turns. One turn must be connected in series in order to achieve the 3:1 ratio. Therefore the further two turns are provided in two parallel branches, each of one turn, in the secondary side.

In the example of FIGS. 7 and 8, the primary winding additionally has two branches, and thus p=2. This means the primary winding requires p*x*y turns, i.e. six turns. The primary wining thus has a first branch of three series windings, and a second branch of three series windings, each branch being connected in parallel.

As a result of the primary winding having p branches, the secondary winding must have p*x/y secondary branches connected in parallel. This is calculated to be six secondary branches. As the secondary winding must also have six (p*x*y) turns, then the secondary winding is constructed to have six branches of one turn each, all connected in parallel.

The exemplary transformer described hereinabove with reference to FIGS. 7 and 8 may provide for the summing of two signals. The invention is not limited in its applicability to the summing of only two signals, and may be applied to sum more than two signals.

In a scenario where N signals are summed, an N-filar winding is preferably used. N windings would then be closely coupled together. The conditions for operation described hereinabove in the two signal summation case must still be met, and each individual turn of each winding must be closely coupled together.

In the case where there are w signals to be summed, w independent primary windings are provided. Each of the w independent primary winding has a respective number of turns x. Each x*y product is found for each independent winding, and then the lowest common multiple found. For example, for a 3:2:1 transformer the x*y products are 3 (for the 3:1 winding) and 2 (for the 2:1 winding). The lowest common multiple in such case, for respective ratios of 2 and 3, is 6. In general, this lowest common multiple may be denoted as t.

For each winding, there then must be t total turns. In this example, this requires each winding to have 6 turns. This require both the independent primary winding to have 6 turns, and the secondary winding to have six turns. The total number of branches in each primary winding is thus t/x, for the x value for the respective independent primary winding. Thus in the example above, for the primary winding with 3 turns 2 branches are required, and for the primary winding with 2 turns 3 branches are required. The branches of the primary windings must be connected in parallel to maintain the transformer ratios.

The total number of secondary turns in the secondary winding must also be t, and the number of secondary parallel branches must be t/y. As in the above example y=1, then the number of secondary parallel branches is 6.

As discussed above, each parallel branch in any winding must contain an equal number of turns.

In a further modification, any of the independent primary windings may be provided with multiple branches. For example, any primary winding may have p branches, such as discussed hereinabove with reference to FIGS. 7 and 8. In such case, the number of turns required in a given primary winding is p*x*y. The total number of turns t is then p*t. If multiple independent primary windings have a plurality p of branches, then the total number of turns in each primary winding would be the lowest common multiple, based on p*x*y for each independent winding, where p may be greater than or equal to one. In such scenario, the secondary winding would require p*t/y branches in parallel.

An embodiment for the summing of multiple signals by the provision of multiple primary winding is considered further herein below. As discussed above, a first primary winding denoted $w_1$ has three turns, and two branches, each with three turns. Thus for the first primary winding $x_1=3$ and $p_1=2$. A second primary winding $w_2$ has two turns and one branch. Thus for the second primary winding $x_2=2$ and $p_2=1$. In order to achieve the desired ratios of 3:1 for the first primary winding and 2:1 for the second primary winding, the second primary winding is required to have one winding of one turn.

The lowest common multiple t is $(p_1*x_1*y)*(p_2*x_2*y)$, which in the example is twelve. Thus t=12, and there is a requirement for each primary winding and the secondary winding to have twelve turns.

In the first primary winding, the number of parallel branches now required is $t/x_1$, i.e. four. In the second primary winding, the number of parallel branches now required is $t/x_2$, i.e. six. In the secondary winding the number of parallel branches required is t/y, i.e. twelve.

In general, there may be provided a plurality of primary windings $w_i$, each having a number of turns $x_i$ in a branch.

In the example of utilising a transformer having multiple primary windings in order to sum multiple signals, the primary signals are all summed together with the voltage that is applied to the input side of the secondary winding.

In an alternative arrangement, multiple secondary windings may be provided. In such case, there may be reciprocal coupling across all the primaries. For this reason, one of the primary windings may be a voltage source, but the remaining primary windings must be current sources to avoid loading the windings.

The present invention has been described herein by way of reference to particular preferred embodiments. However the invention is not limited to such embodiments. The present invention has particular application in relation to RF amplifiers, but is not limited to such implementation. The invention can be advantageously utilised in any environment where switched, selectable voltage supplies are provided.

The described preferred embodiments utilising an RF amplifier are not limited to any particular load being driven by such RF amplifier. However it is envisaged that such an RF amplifier will typically drive an antenna. As such, the present invention has particularly advantageous uses in the field of communications, including the field of mobile communications.

The invention claimed is:

1. A modulated power supply including a voltage summer, a first voltage source, and a second voltage source, for providing a modulated power supply voltage, the voltage summer including a transformer having a primary side and a secondary side, wherein the first voltage source is connected to provide a first voltage to one side of the transformer, and the second voltage source is connected to provide a second voltage to another side of the transformer, wherein the transformer provides a modulated output voltage representing the first voltage adjusted by the second voltage.

2. A modulated power supply according to claim 1, wherein the first voltage is connected between the first tap of the primary side and the second tap of the primary side, and the second voltage is connected to a first tap of the secondary side, the modulated output voltage being provided on a second tap of the primary or secondary side.

3. A modulated power supply according to claim 2, wherein the first voltage is greater than the second voltage and the modulated output voltage is provided on the second tap of the primary side of the transformer.

4. A modulated power supply according to claim 1 wherein the first voltage is a variable voltage.

5. A modulated power supply according to claim 4 wherein the first voltage is provided by a first switchable voltage source.

6. A modulated power supply according to claim 4 wherein the second voltage is a variable voltage.

7. A modulated power supply according to claim 6 wherein the second voltage is provided by a second switchable voltage source.

8. A modulated power supply according to claim 6 wherein the first voltage is variable between n levels and the second voltage is variable between m levels, wherein the summed voltage is variable between n*m levels.

9. A modulated cower supply according to claim 6 wherein the second voltage is provided by a continuously variable voltage source.

10. A modulated power supply according to claim 6 wherein the second voltage is provided by a fixed voltage source.

11. A modulated cower supply according to claim 1 wherein the first voltage is a coarse voltage signal and the second voltage is a fine voltage signal.

12. A modulated cower supply according to claim 11 wherein the fine voltage signal is representative of an error in the coarse voltage signal.

13. A modulated power supply according to claim 12, further including a reference voltage source, and a difference means for removing the reference voltage from the summed voltage to generate the second voltage.

14. A modulated cower supply according to claim 12, further including a reference current source, a means for sensing the current in the primary side of the transformer, a difference means for removing the reference current from the sensed current to generate a difference current, and a driver for supplying the second voltage in dependence on the difference current.

15. A method of providing a modulated power supply including applying a first voltage to one side of a transformer and applying a second voltage to another side of the transformer, wherein a sum of the first and second voltages provides a modulated output voltage on one of the first or second sides of the transformer representing the first voltage adjusted by the second voltage.

16. A method of providing a modulated power supply according to claim 15, wherein the first voltage is applied between a first tap of a primary side and a second tap of the primary side, and the second voltage is applied to a first tap of a secondary side, wherein the modulated output voltage is provided on a second tap of the primary or secondary side.

17. A method of providing a modulated power supply according to claim 16, wherein the first voltage is greater than the second voltage and the modulated output voltage is provided on the second tap of the primary side of the transformer.

18. A method of providing a modulated power supply according to claim 15 further comprising the step of varying the first voltage.

19. A method of providing a modulated power supply according to claim 15 further comprising the step of varying the second voltage.

20. A method of providing a modulated power supply according to claim 18 comprising varying the first voltage between n levels and varying the second voltage between m levels, wherein the modulated output voltage is thereby variable between n*m levels.

21. A method of providing a modulated power supply according to claim 15 wherein the first voltage is a coarse voltage signal and the second voltage is a fine voltage signal.

22. A method of providing a modulated power supply according to claim 21 wherein the fine voltage signal is representative of an error in the coarse voltage signal.

23. A method of providing a modulated power supply according to claim 15, further including the step of generating a reference voltage, and removing the reference voltage from the summed voltage to thereby generate the second voltage.

24. A method of providing a modulated power supply according to claim 15, further including the step of generating a reference current, sensing the current in the primary side of the transformer, removing the reference current from the sensed current to generate a difference current, and supplying the second voltage in dependence on the difference current.

25. A modulated power supply according to claim 1 wherein the first voltage source is independent of the second voltage source.

26. A modulated power supply according to claim 1 wherein the first voltage is directly connected to the one side of the transformer and the second voltage is directly connected to the other side of the transformer.

27. A method according to claim 15 wherein the first voltage is independent of the second voltage.

28. A method according to claim 15 comprising directly connecting the main voltage to the one side of the transformer and directly connecting the correction voltage to the other side of the transformer.

* * * * *